United States Patent
Das

(10) Patent No.: US 10,862,467 B2
(45) Date of Patent: Dec. 8, 2020

(54) CAPACITOR RATIO IDENTIFICATION

(71) Applicant: Texas Instruments Incorporated, Dallas, TX (US)

(72) Inventor: Abhijit Kumar Das, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/733,015

(22) Filed: Jan. 2, 2020

(65) Prior Publication Data

US 2020/0287526 A1 Sep. 10, 2020

Related U.S. Application Data

(63) Continuation of application No. 16/291,550, filed on Mar. 4, 2019, now Pat. No. 10,560,079.

(51) Int. Cl.
| | |
|---|---|
| *H03K 5/131* | (2014.01) |
| *H03K 19/20* | (2006.01) |
| *H03K 19/21* | (2006.01) |
| *G01R 27/26* | (2006.01) |
| *H03K 5/00* | (2006.01) |

(52) U.S. Cl.
CPC ......... *H03K 5/131* (2013.01); *G01R 27/2605* (2013.01); *H03K 19/20* (2013.01); *H03K 19/21* (2013.01); *H03K 2005/00058* (2013.01)

(58) Field of Classification Search
None
See application file for complete search history.

(56) References Cited

U.S. PATENT DOCUMENTS

| | | | |
|---|---|---|---|
| 7,061,225 B2 | 6/2006 | Yang et al. | |
| 9,124,279 B2 | 9/2015 | Dai | |
| 10,560,079 B1* | 2/2020 | Das ................. | H03K 5/131 |
| 2007/0013454 A1* | 1/2007 | Ji ..................... | H03K 3/0315 331/57 |
| 2016/0118967 A1* | 4/2016 | Krishnamurthy ..... | H03L 7/0818 327/158 |
| 2018/0026644 A1* | 1/2018 | Shankar ............. | G06F 1/3296 326/41 |
| 2019/0222201 A1 | 7/2019 | Wang et al. | |
| 2019/0326956 A1* | 10/2019 | Balasubramanian .... | H03K 5/24 |

* cited by examiner

*Primary Examiner* — Lincoln D Donovan
*Assistant Examiner* — Khareem E Almo
(74) *Attorney, Agent, or Firm* — Michelle F. Murray; Charles A. Brill; Frank D. Cimino

(57) ABSTRACT

A system includes an oscillator comprising a first switch, a current source, a capacitor, and a comparator, the capacitor and the comparator coupled at a node. The system includes one or more delay buffers coupled to the comparator. The system includes a first inverter coupled to the one or more delay buffers. The system includes a first buffer coupled to the one or more delay buffers. The system includes a first coupling capacitor coupled to the first inverter and the first buffer via second and third switches, respectively. The system includes a second inverter coupled to the one or more delay buffers. The system includes a second buffer coupled to the one or more delay buffers. The system includes a second coupling capacitor coupled to the second inverter and the second buffer via fourth and fifth switches, respectively. The first and second coupling capacitors are coupled to the oscillator.

20 Claims, 6 Drawing Sheets

US 10,862,467 B2

CAPACITOR RATIO IDENTIFICATION

This continuation application claims priority to U.S. non-provisional application Ser. No. 16/291,550 filed Mar. 4, 2019, which is hereby incorporated herein by reference in its entirety.

SUMMARY

In accordance with at least one example of the disclosure, a system includes an oscillator comprising a first switch, a current source, a capacitor, and a comparator, the capacitor and the comparator coupled at a node. The system includes one or more delay buffers coupled to the comparator. The system includes a first inverter coupled to the one or more delay buffers. The system includes a first buffer coupled to the one or more delay buffers. The system includes a first coupling capacitor coupled to the first inverter and the first buffer via second and third switches, respectively. The system includes a second inverter coupled to the one or more delay buffers. The system includes a second buffer coupled to the one or more delay buffers. The system includes a second coupling capacitor coupled to the second inverter and the second buffer via fourth and fifth switches, respectively. The first and second coupling capacitors are coupled to the oscillator.

In accordance with an example, a system includes an oscillator including a first switch, a current source, a capacitor, and a comparator, the capacitor and the comparator coupled at a node. The system includes one or more delay buffers coupled to an output of the comparator. The system includes a digital controller and a first XOR gate coupled to the one or more delay buffers and the digital controller. The system includes a first AND gate coupled to an output of the first XOR gate and to the digital controller. The system includes a first coupling capacitor coupled to an output of the first AND gate and a second XOR gate coupled to the one or more delay buffers and the digital controller. The system includes a second AND gate coupled to an output of the second XOR gate and to the digital controller and a second coupling capacitor coupled to an output of the second AND gate. The first and second coupling capacitors are coupled to the oscillator at the node.

In an example, a method includes providing current from a current source to an oscillator, the oscillator comprising a first switch, a capacitor and a comparator, the capacitor and the comparator coupled at a node. The method includes providing an output from the comparator to a delay buffer coupled to the comparator. The method includes providing, by a digital controller, a positive offset to a voltage at the node using an output of the delay buffer and a first coupling capacitor while simultaneously logically isolating, by the digital controller, a second coupling capacitor from the delay buffer. The method includes determining, by the digital controller, a first frequency of the voltage at the node. The method includes providing, by the digital controller, a negative offset to the voltage at the node using the output of the delay buffer and the first coupling capacitor while simultaneously logically isolating, by the digital controller, the second coupling capacitor from the delay buffer. The method includes determining, by the digital controller, a second frequency of the voltage at the node. The method includes determining, by the digital controller, a difference based on the first and second frequencies.

BRIEF DESCRIPTION OF THE DRAWINGS

For a detailed description of various examples, reference will now be made to the accompanying drawings in which.

DETAILED DESCRIPTION

Chips are often assigned unique identifiers. Typically, such identifiers are implemented on the chip using electronic fuses or other, similar devices. Such devices are easy to access physically, thus rendering the identifiers susceptible to theft and misuse.

Described herein are various examples of an illustrative capacitor ratio identification system. The system may include multiple capacitors. The capacitance ratio(s) of these capacitors may be used as chip identifiers, which may in turn be used as, e.g., physically unclonable functions (PUFs). Such capacitance ratios may be superior chip identifiers relative to electronic fuses and other such devices because they cannot easily be read. Rather, the capacitance ratios may only be ascertained using specific analog measurement circuitry. The capacitor ratio identification system includes such analog measurement circuitry and examples of such circuitry are now described with reference to the drawings.

Figure 1A:
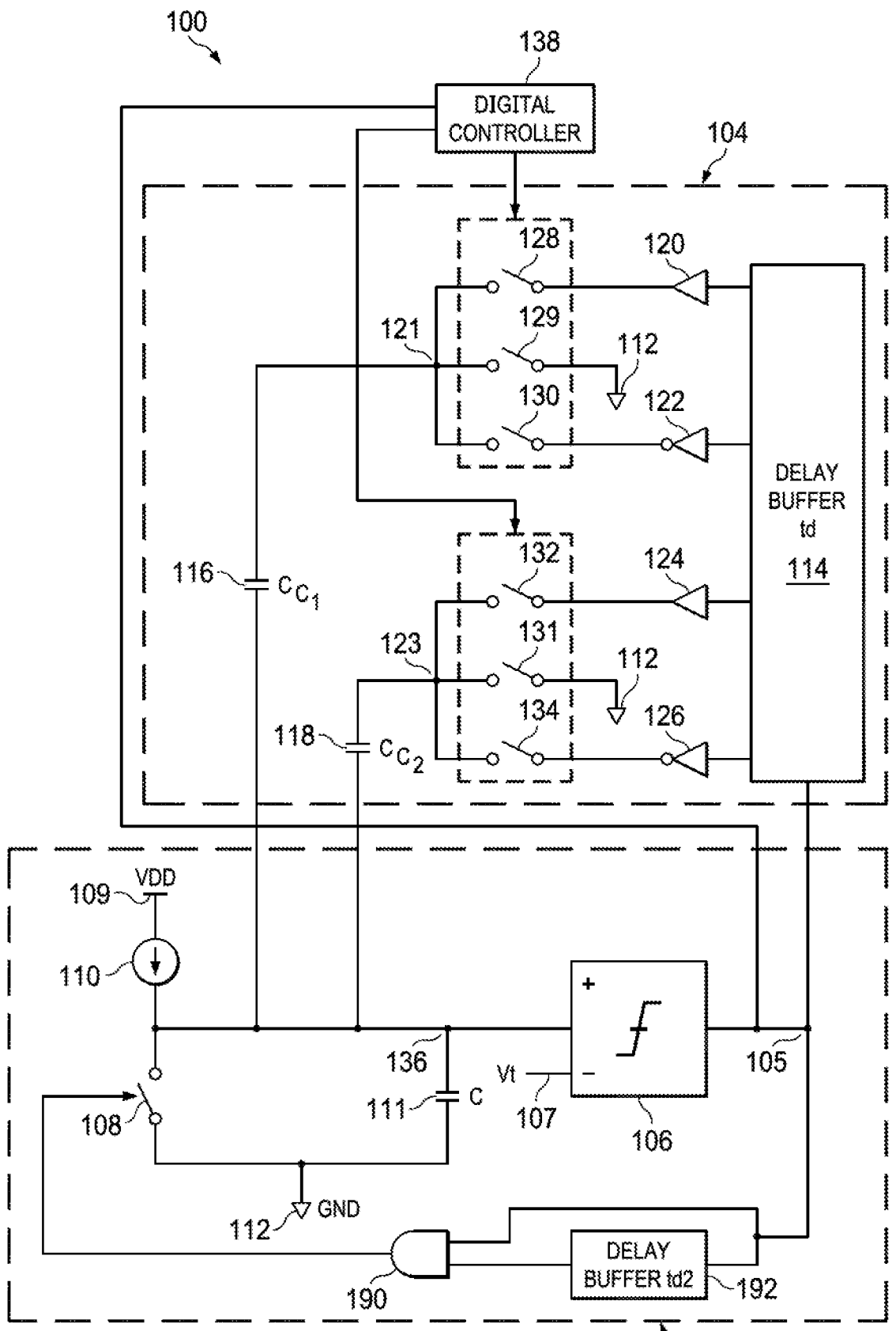
FIG. 1A is a circuit schematic diagram of an illustrative capacitor ratio identification system in accordance with various examples.

FIG. 1A is a circuit schematic diagram of an illustrative capacitor ratio identification system 100 in accordance with various examples. In examples, the system 100 may include an oscillator 102 and a capacitance measurement circuit 104 coupled to the oscillator 102. The system 100 may further include a digital controller 138 coupled to the oscillator 102 and to the capacitance measurement circuit (CMC) 104. As described below, the CMC 104 may include a pair of capacitors (although any number of capacitors is usable (e.g., two, four, eight), two capacitors are assumed in this disclosure for convenience), the capacitance ratio of which may serve as an identifier for the chip or other device on which the system 100 is implemented. As also described below, the digital controller 138 may use the CMC 104 and an oscillating signal produced by the oscillator 102 to determine the capacitance ratio of the pair of capacitors in the CMC 104. The oscillator 102, the CMC 104, and the digital controller 138 are now described in more detail.

In examples, the oscillator 102 may include a capacitor 111; a comparator 106 coupled to the capacitor 111 at a node 136; a reference input 107 (e.g., an inverting input) on which a reference signal Vt is provided; a switch 108 (e.g., a transistor, such as a metal oxide semiconductor field effect transistor (MOSFET)); a current source 110 (e.g., a MOSFET) coupled to a voltage source VDD 109; and ground 112 coupled to the switch 108 and to the capacitor 111. The node 136 may couple to the comparator 106 via, e.g., a non-inverting input, and the output of the comparator 106 may be provided at a node 105. A delay buffer 192 and AND gate 190 may be positioned between the node 105 and switch 108, as shown.

In operation, the oscillator 102 may produce an oscillating signal at the node 136. Specifically, the current source 110 may cause the capacitor 111 to build up charge while the switch 108 is open. When the charge of the capacitor 111 is high enough such that the voltage at the node 136 exceeds Vt, the output of the comparator 106 may switch from 0 to 1—stated another way, the signal at node 105 may switch from 0 to 1. This may cause the switch 108 to close after a delay td2, as explained below. When the switch 108 closes, the node 136 may couple to ground 112 such that the capacitor 111 is shorted and the voltage at node 136 drops to 0V instantaneously. Because the node 136 may have a voltage of 0V which is less than Vt, the output of the comparator 106 may switch from 1 back to 0, thus causing the switch 108 to open. Because the switch 108 is open, the capacitor 111 may again begin to store charge, and the aforementioned process may repeat. In this manner, an oscillating signal is produced at node 136. The oscillating signal, in some examples, has a sawtooth waveform, such as waveform 306 in FIG. 4 (which is described in further detail below).

In examples, the CMC 104 may include a delay buffer 114 having an input coupled to the node 105; buffers 120 and 124 coupled to the output of the delay buffer 114; inverters 122 and 126 coupled to the output of the delay buffer 114; a switch 128 (e.g., a MOSFET) coupled to an output of the buffer 120; a switch 129 (e.g., a MOSFET) coupled to ground 112; a switch 130 (e.g., a MOSFET) coupled to an output of the inverter 122; a switch 132 (e.g., a MOSFET) coupled to an output of the buffer 124; a switch 131 (e.g., a MOSFET) coupled to ground 112; and a switch 134 (e.g., a MOSFET) coupled to an output of the inverter 126. As indicated by the dashed box circumscribing the switches 128, 129, and 130, these switches may be controlled by the digital controller 138. As indicated by the dashed box circumscribing the switches 132, 131, and 134, these switches may be controlled by the digital controller 138. The switches 128, 129, and 130 may couple together at a node 121 coupled to the coupling capacitor 116, and the switches 132, 131, and 134 may couple together at a node 123 coupled to the coupling capacitor 118. The digital controller 138 may couple to the node 105, as shown.

The operation of the system 100 is now described with reference to FIGS. 1A and 3. As explained above, the oscillating signal produced at node 136 by the oscillator 102 is shown in the timing diagram 300 of FIG. 4 as waveform 306. Specifically, as time (x-axis) increases, the voltage (y-axis) at the node 136 increases (due to charging of the capacitor 104) and drops instantaneously or substantially instantaneously (due to shorting of the node 136 to ground 112 via the switch 108). This oscillation pattern may repeat, as waveform 306 depicts.

The node 105 may couple to the delay buffer 114. When the comparator 106 outputs a signal (e.g., a 0 or 1) to the node 105, the delay buffer 114 may apply a predetermined time delay (e.g., td 318) to the signal at node 105 prior to providing the signal at node 105 to the inverters 122, 126 and buffers 120, 124. After the time delay td has elapsed, the buffers 120, 124 may output the signal at node 105 to their respective switches, and the inverters 122, 126 may output inverted signals from the node 105 to their respective switches.

The signals that are provided to the coupling capacitors 116, 118 may depend on the statuses of the switches 128, 129, 130, 131, 132, and 134, which may be controlled by the digital controller 138. In examples, the digital controller 138 may be programmed to control these switches so that: during a first phase, switch 128 is closed, thus providing the output of the buffer 120 to the coupling capacitor 116, the switch 131 is closed, thus coupling the coupling capacitor 118 to ground 112, and the remaining switches 129, 130, 132, and 134 are open; during a second phase, switch 130 is closed, thus providing the output of the inverter 122 to the coupling capacitor 116, the switch 131 is closed, thus coupling the coupling capacitor 118 to ground 112, and the remaining switches 128, 129, 132, and 134 are open; during a third phase, switch 132 is closed, thus providing the output of the buffer 124 to the coupling capacitor 118, switch 129 is closed, thus coupling the coupling capacitor 116 to ground, and the switches 128, 130, 131, and 134 are open; and during a fourth phase, the switch 134 is closed, thus providing the output of the inverter 126 to the coupling capacitor 118, the switch 129 is closed, thus coupling the coupling capacitor 116 to ground 112, and the remaining switches 128, 130, 132, and 131 are open. The digital controller 138 may be programmed to enable each of these four phases for any suitable length of time, in any suitable order (e.g., despite their names, the fourth phase may be enabled prior to the first phase), and any suitable number of times.

Figure 4:
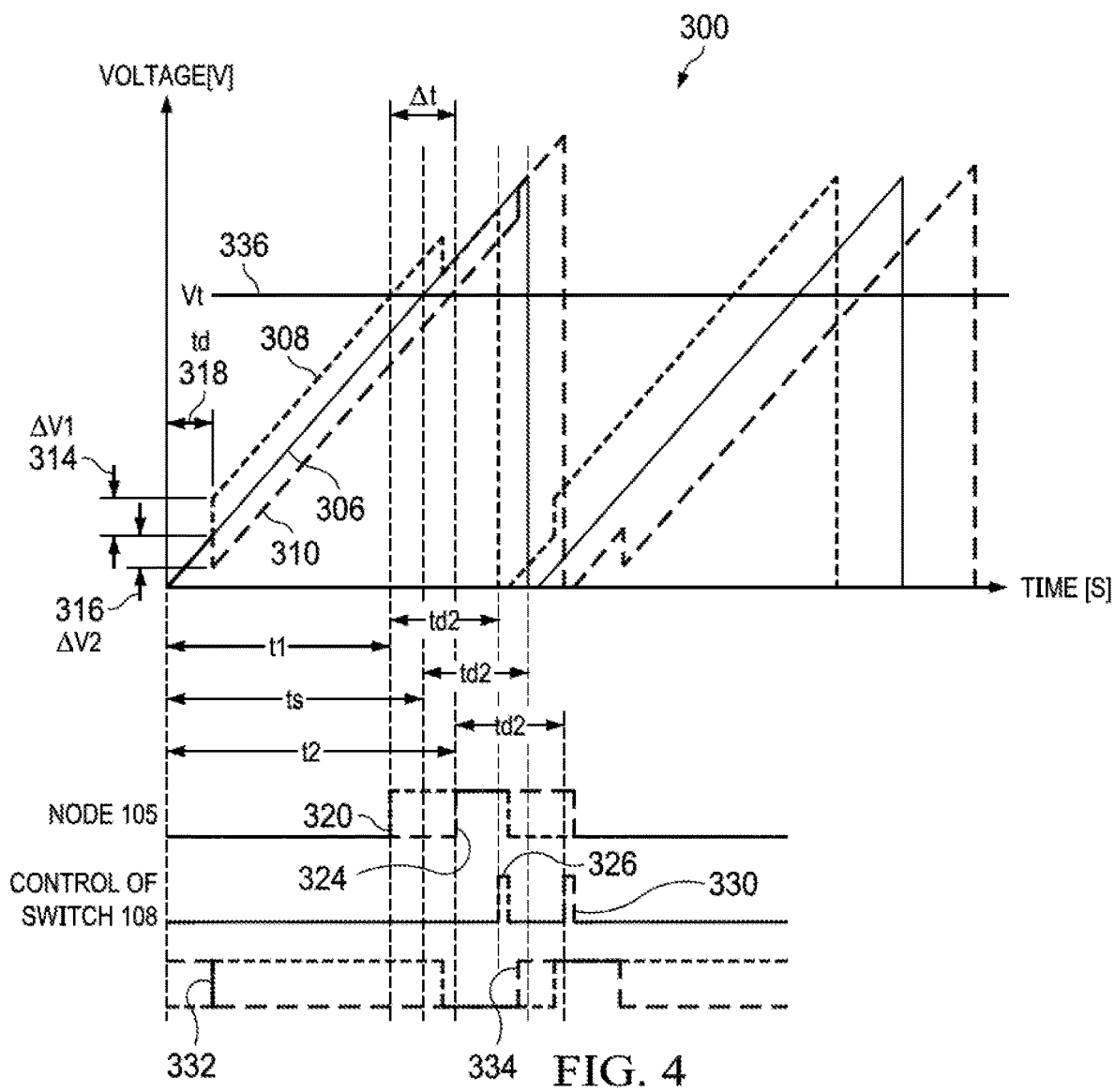
FIG. 4 is a timing diagram associated with an illustrative capacitor ratio identification system in accordance with various examples.

During the first phase, the switch 131 may be closed so that a change in state at node 105 does not impact node 106 via the coupling capacitor 118. The switch 128 may also be closed so that the output of the comparator 106 that is provided to the node 105 and that is delayed by td at the delay buffer 114 may then be applied to the coupling capacitor 116, which, in turn, may boost or reduce the amplitude of the voltage at the node 136, depending on whether the signal transition at the output of delay buffer 114 is 0 to 1 or 1 to 0. (This transition tracks the output at node 105 with an added delay td.) For example, assume the node 105 is transitioning from 0 to 1 as the voltage at node 136 rises and exceeds the Vt at 107. After a delay td, the buffer 120 output may transition from 0 to 1, which may be applied to the coupling capacitor 116. During this time, the output of the comparator 106 (i.e., the state at node 105) is already 1 and, thus, this jump in voltage at node 136 does not impact frequency. This transition at node 105 passes through the delay buffer 192 that applies a delay td2 (where td2 is equal to or greater than delay td), the output of which is then applied to the AND gate 190. The output of the AND gate 190 transitions to 1 after time td2. At this time, the switch 108 closes and resets the voltage at node 136 to 0 V. This causes the comparator 106 output to transition from 1 to 0. This transition experiences a delay td in delay buffer 114 and is applied to the input of buffer 120 after the time td. This may cause the voltage at node 136 to be reduced by an amount V2 316, as shown in FIG. 4. Specifically, waveform 310 shows the signal at node 136 during the first phase. The waveform 310 matches the waveform 306 until td 318 has elapsed (assuming common starting conditions), at which point the transition at the output of buffer 120 causes the voltage at node 136 to decrease by a magnitude of V2 316. The resulting signal will still have the same slope as waveform 306, because the total capacitance at node 136 remains the same. The waveform 310 goes to the input of the comparator 106 and once it crosses Vt at 107, it causes the node 105 to change to 1. This, in turn, closes the switch 108. The waveform 310 may reach its peak just before (and until) the switch 108 is closed and the voltage at node 136 may rapidly drop to 0V, as waveform 310 depicts. The process may continue to repeat as long as the switching configuration of the first phase remains in place. In examples, the digital controller 138 may record the signals at node 105. The digital controller 138 may analyze the signals, for example, by determining the time period of each waveform cycle and/or the frequency of each waveform.

As waveform 324 depicts in FIG. 4, the node 105 may transition from 0 to 1 as the corresponding waveform 310 exceeds Vt 336 (e.g., the Vt provided at 107 in FIG. 1A). Waveform 330 depicts activation of the switch 108 and the substantially simultaneous drop in voltage at node 136 as depicted in the corresponding waveform 310. The time between when the rising waveform 310 crosses Vt 336 and the time that the switch 108 switches on (waveform 330) is time td2, which is controlled by delay buffer 192. Waveform 334 depicts the output of the buffer 120, the rise of which causes a corresponding, substantially simultaneous rise in the waveform 310, and the fall of which causes a corresponding, substantially simultaneous fall in the waveform 310. As shown, the delay between the fall of waveform 324 and the subsequent fall of waveform 334 is delay td. As also shown, the rise of waveform 330 (i.e., the activation of switch 108) causes the waveform 310 to drop, which causes the waveform 330 to quickly drop as well (i.e., the deactivation of switch 108).

During the second phase, the switch 130 may be closed, the switch 131 may be closed, and the remaining switches controlled by the digital controller 138 may be open. Because the switch 130 is closed, the output of the comparator 106 may be delayed by td, inverted by inverter 122, and provided to the coupling capacitor 116. For example, assuming the output of the comparator 106 at node 105 is transitioning from 0 to 1 as the node 136 voltage increases and exceeds Vt, after the delay td is applied to the signal, the transition from 0 to 1 may be inverted to a transition from 1 to 0 by the inverter 122. The output of the inverter 122 may be provided to the coupling capacitor 116. In this example, the output of the inverter 122 is changing from 1 to 0 due to the node 105 changing from 0 to 1. This change at the output of the inverter 122 occurs at a time td after the change at node 105. The frequency of the signal at node 136 is not impacted by the 1 to 0 change at the output of inverter 122 as the node 105 is already at 1 when this occurs. The transition at node 105 may pass through delay buffer 192, and the output of the AND gate 190 may then transition from 0 to 1 after time td2. At that time, the switch 108 may close and node 136 may reset to 0. This may cause the comparator 106 output to transition from 1 to 0. This transition may pass through delay buffer 114 and be provided to the input of inverter 122 after time td. The transition, once inverted by inverter 122, may be provided to capacitor 116 and so the voltage signal at the node 136 may be pushed upward after td 318 has elapsed, as shown by waveform 308 in FIG. 4. This upward bias is labeled as delta V1 314 in FIG. 4. The waveform 308 may continue to increase in amplitude over time as the capacitor 111 continues to charge while switch 108 is open. Once the capacitor 111 is charged such that the voltage at node 136 exceeds Vt, the comparator 106 may output a 1 at node 105. This pattern may continue repeatedly, as long as the present switching configuration of the switches controlled by the digital controller 138 remains in place. The digital controller 138 may store the signal present at node 105 and may analyze it to determine, for example, the time period and/or frequency associated with the waveform 308.

As waveform 320 depicts in FIG. 4, the signal at node 105 transitions from 0 to 1 when the corresponding waveform 308 exceeds Vt 336. Waveform 326 depicts activation of the switch 108 and the substantially simultaneous drop in voltage at node 136 as depicted in the corresponding waveform 308. The time between when the rising waveform 308 crosses Vt 336 and the time that the switch 108 switches on (waveform 326) is time td2. Waveform 332 depicts the output of the inverter 122, the rise of which causes a corresponding, substantially simultaneous rise in the waveform 308, and the fall of which causes a corresponding, substantially simultaneous fall in the waveform 308. As shown, the delay between the rise of waveform 320 and the subsequent fall of waveform 332 is delay td. As also shown, the rise of waveform 326 (i.e., the activation of switch 108) causes the waveform 308 to drop, which causes the waveform 326 to quickly drop as well (i.e., the deactivation of switch 108).

The digital controller 138 may determine a difference between the time periods associated with the waveforms 308, 310. Stated in a different way, the digital controller 138 may determine a time period difference based on the frequencies associated with the waveforms 308, 310. The results of such calculations may be stored in the digital controller 138.

During the third phase, the digital controller 138 may close switch 129, thus coupling the coupling capacitor 116 to ground 112 and rendering the coupling capacitor 116 irrelevant to the voltage at node 136 due to the transition at node 105. In addition, during the third phase, the digital controller 138 may close switch 132 and leave the remaining switches open, thus causing the buffer 124 to couple to the coupling capacitor 118. The system 100 then operates similarly to the operation described above with respect to the first phase and the behaviors of waveforms 310, 324, 330, and 334 in FIG. 4. The digital controller 138 may record the signal at node 136 and may store it for future analysis. For example, the digital controller 138 may use the recorded signal to determine a time period and/or frequency associated with the signal.

During the fourth phase, the digital controller 138 may close switch 129, thus rendering coupling capacitor 116 irrelevant to the voltage at node 136 due to the transition at node 105. Also during the fourth phase, the digital controller 138 may close switch 134, thus coupling the inverter 126 to the coupling capacitor 118. The digital controller 138 may keep the remaining switches open. The system 100 then operates similarly to the operation described above with respect to the second phase and the behaviors of waveforms 308, 320, 326, and 332 in FIG. 4. The digital controller 138 may record the signal at node 136 and may store it for future analysis. For example, the digital controller 138 may use the recorded signal to determine a time period and/or frequency associated with the signal.

In sum, the first phase may produce a signal at node 136 that is similar to waveform 310; the second phase may produce a signal at node 136 that is similar to waveform 308; the third phase may produce a signal at node 136 that is similar to waveform 310; and the fourth phase may produce a signal at node 136 that is similar to waveform 308. These signals may be recorded and stored by the digital controller 138 for analysis and subsequent action based on the analysis.

In examples, the digital controller 138 may analyze the waveforms from the first, second, third, and fourth phases as follows. The digital controller 138 may determine a period of the waveform from the first phase. The digital controller 138 may determine a period of the waveform from the second phase. The digital controller 138 may determine a period of the waveform from the third phase. The digital controller 138 may determine a period of the waveform from the fourth phase. In examples, the periods from the first and third phases are illustrated by time t2+td2 of waveform 310 in FIG. 4. In examples, the periods from the second and fourth phases are illustrated by time t1+td2 of waveform 308 in FIG. 4. In examples, the digital controller 138 may determine frequencies instead of periods. The terms "frequency" and "period" may be used somewhat interchangeably herein, as these parameters are inverses of each other.

After determining the aforementioned periods (or frequencies), the digital controller 138 may determine a difference between the periods of the signals from the first and second phases, and it may determine a difference between the periods of the signals from the third and fourth phases. These differences are illustrated as, e.g., delta t in FIG. 4. The digital controller 138 may subsequently determine a ratio of the aforementioned differences. This ratio is equivalent to the capacitance ratio of the coupling capacitors 116 and 118. Thus, in this manner, the system 100 is able to determine the capacitance ratio of capacitors that are used as identifiers for a chip or other device on which the system 100 is implemented. The ratio is stable over time and in various environments and can be identified using the circuitry shown in FIG. 1A. Because such circuitry is necessary to identify the ratio and the ratio is not written in or otherwise encoded on the chip or other device on which the system 100 is implemented, the identifier (i.e., ratio) is difficult to misappropriate.

Figure 1B:
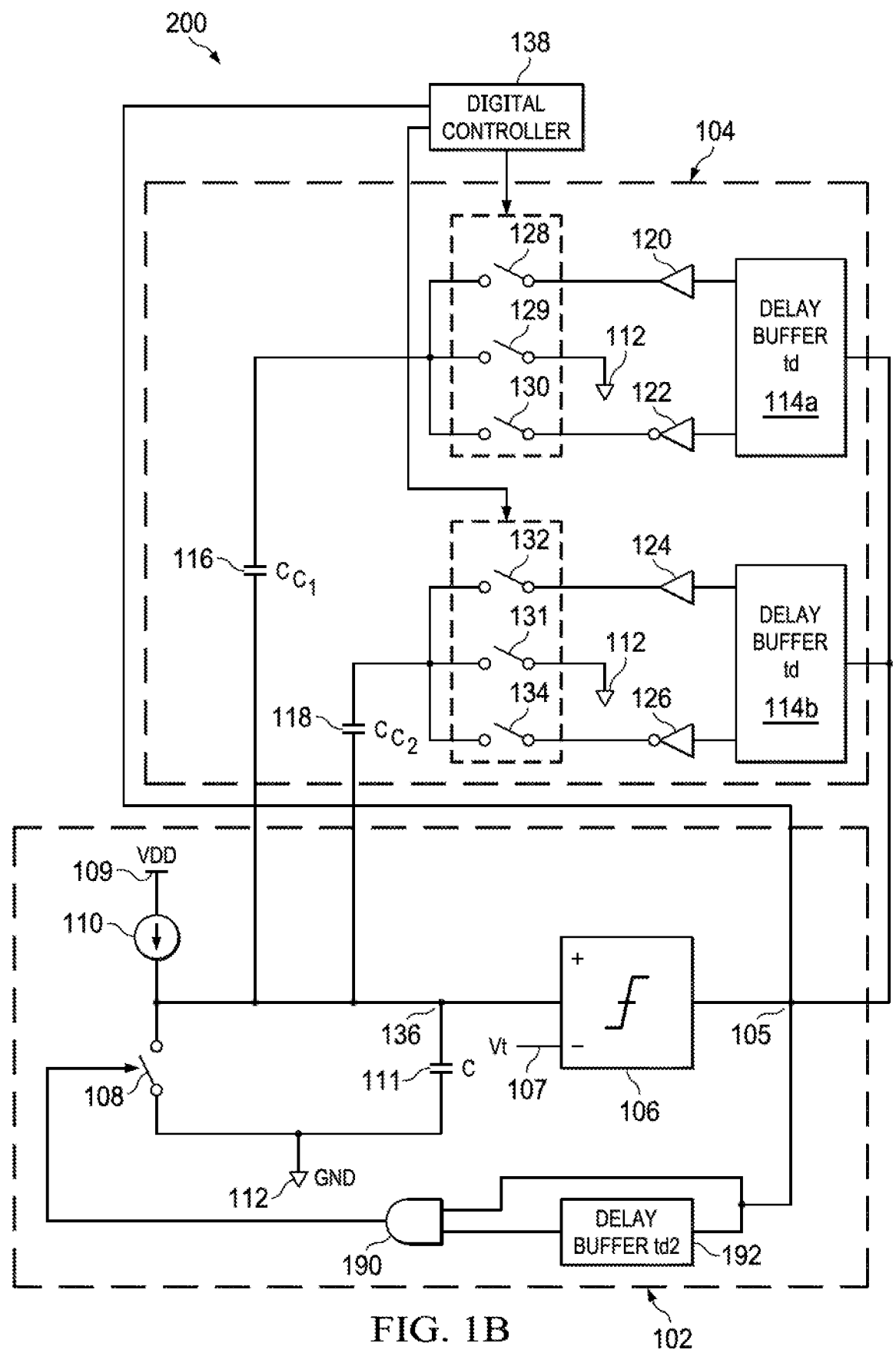
FIG. 1B is a circuit schematic diagram of another illustrative capacitor ratio identification system in accordance with various examples.

FIG. 1B is a circuit schematic diagram of another illustrative capacitor ratio identification system 200 in accordance with various examples. The system 200 may be similar to the system 100 of FIG. 1A except that the CMC 104 of system 200 may include multiple delay buffers 114A, 114B. For example, as shown in FIG. 1B, the delay buffer 114A may couple to the node 105 at an input and to the buffer 120 and inverter 122 at outputs. Similarly, as shown in FIG. 1B, the delay buffer 114B may couple to the node 105 at an input and to the buffer 124 and inverter 126 at outputs. The operation of the system 200 may be substantially similar to the operation of the system 100.

Figure 2A:
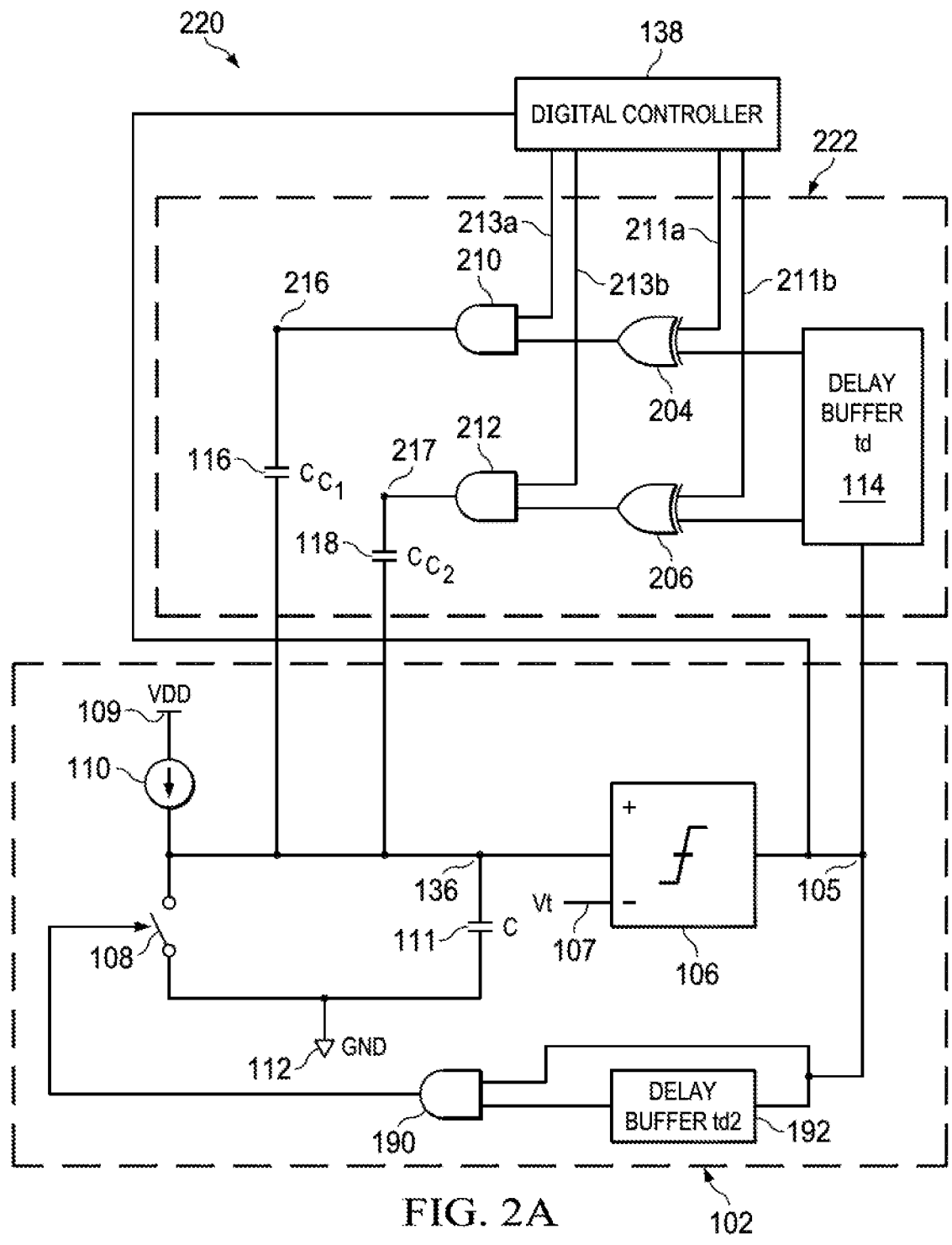
FIG. 2A is a circuit schematic diagram of another illustrative capacitor ratio identification system in accordance with various examples.

FIG. 2A is a circuit schematic diagram of another illustrative capacitor ratio identification system 220 in accordance with various examples. The operation of the system 220 may be similar to that of system 100. However, the system 220 may include a CMC 222 that differs from the CMC 104 in that the CMC 222 may include logic gates 204, 206, 210, and 212 to implement the functionality of the inverters, buffers, and switches of the CMC 104. Specifically, the CMC 222 may include a delay buffer 114 coupled to node 105 at an input. The outputs of the delay buffer 114 may couple to XOR gates 204 and 206. The XOR gates 204 and 206 also may receive control signals from the digital controller 138 via control signals 211a, 211b, respectively. Outputs of the XOR gates 204, 206 may be provided to AND gates 210, 212, respectively. The AND gates 210, 212 also may receive control signals from the digital controller 138 via connections 213a, 213b, respectively. An output of the AND gate 210 may couple to coupling capacitor 116 via connection 216, and an output of the AND gate 212 may couple to coupling capacitor 118 via connection 217.

In operation, the control signals on connections 213a, 213b may act as enable signals. When these signals are 0, the outputs of the AND gates 210, 212 may also be 0, regardless of the outputs of the XOR gates 204, 206. When the outputs of either of the AND gates 210, 212 is 0, the respective coupling capacitor 116, 118 may have no appreciable effect on the voltage at node 136 due to the transition at node 105. The end result is as if a coupling capacitor 116, 118 in FIG. 1A couples to ground 112 via switch 129 or 131. This situation is referred to herein as "logical isolation."

Assuming the control signals on either of the connections 213a, 213b is 1, the corresponding AND gate 210, 212 may output a 0 or a 1, depending on the input received from the corresponding XOR gate 204, 206. The XOR gates 204, 206 may function as inverters or as buffers (such as those in FIG. 1A), depending on the control signals 211a, 211b. For example, if either of the control signals 211a, 211b is 0, the corresponding XOR gate may behave as a buffer, meaning that the output of the delay buffer 114 may pass through that XOR gate unchanged. If, however, either of the control signals 211a, 211b is 1, the corresponding XOR gate may behave as an inverter, meaning that the output of the delay buffer 114 may be inverted as it passes through that XOR gate. In this way, the combination of the XOR gate 204 and the AND gate 210 may provide similar functionality as the inverters, buffers, and switches of FIG. 1A. The same may be true of the combination of the XOR gate 206 and the AND gate 212.

Figure 2B:
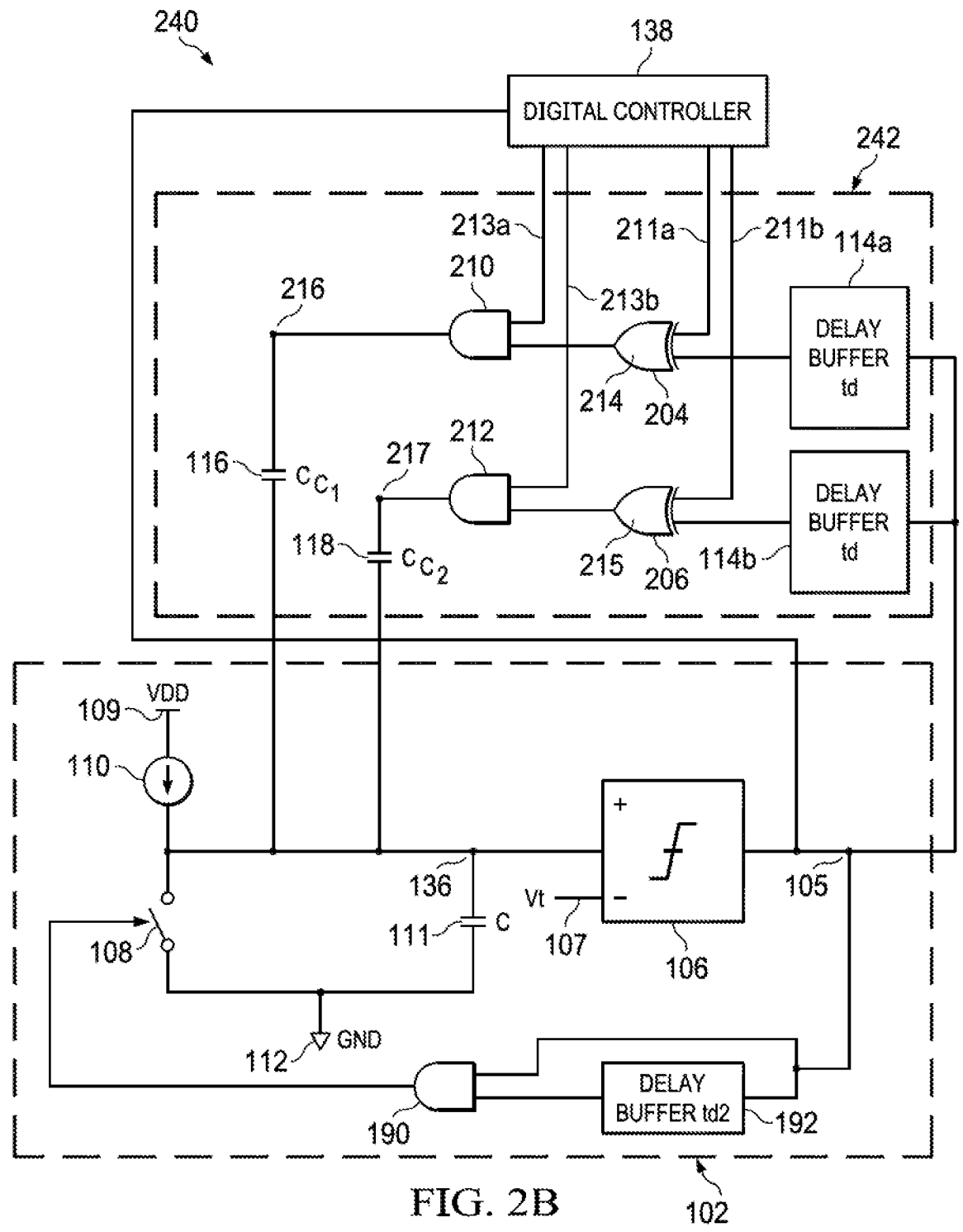
FIG. 2B is a circuit schematic diagram of another illustrative capacitor ratio identification system in accordance with various examples.

FIG. 2B is a circuit schematic diagram of another illustrative capacitor ratio identification system 240 in accordance with various examples. The system 240 is similar to the system 220 of FIG. 2A, except that the CMC 242 of the system 240 includes two delay buffers 114a, 114b instead of one delay buffer 114.

In FIGS. 1A-2B, examples are shown that includes either one delay buffer or a pair of delay buffers in the CMC. In other examples, three or more delay buffers may be used in the CMC, depending on the number of coupling capacitors used in those examples.

Figure 3:
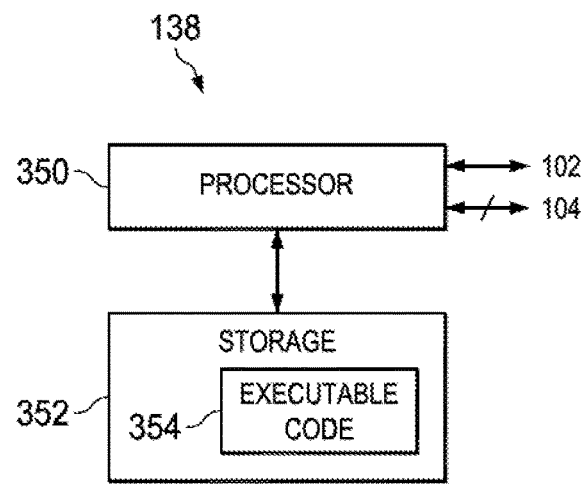
FIG. 3 is a block diagram of an illustrative digital controller, in accordance with various examples.

FIG. 3 is a block diagram of the illustrative digital controller 138, in accordance with various examples. The digital controller 138 may include a processor 350 coupled to storage 352 (e.g., random access memory, read-only memory). The storage 352 is a non-transitory computer-readable storage medium. The storage 352 includes executable code 354 which, when executed by the processor 350, causes the processor 350 to perform some or all of the actions attributed herein to the digital controller 138. The processor 350 communicates with the oscillator 102 and CMC 104, as indicated by the arrows in FIG. 3. The processor 350 may also communicate with other examples of oscillators, CMCs, and other components as appropriate.

Figure 5:
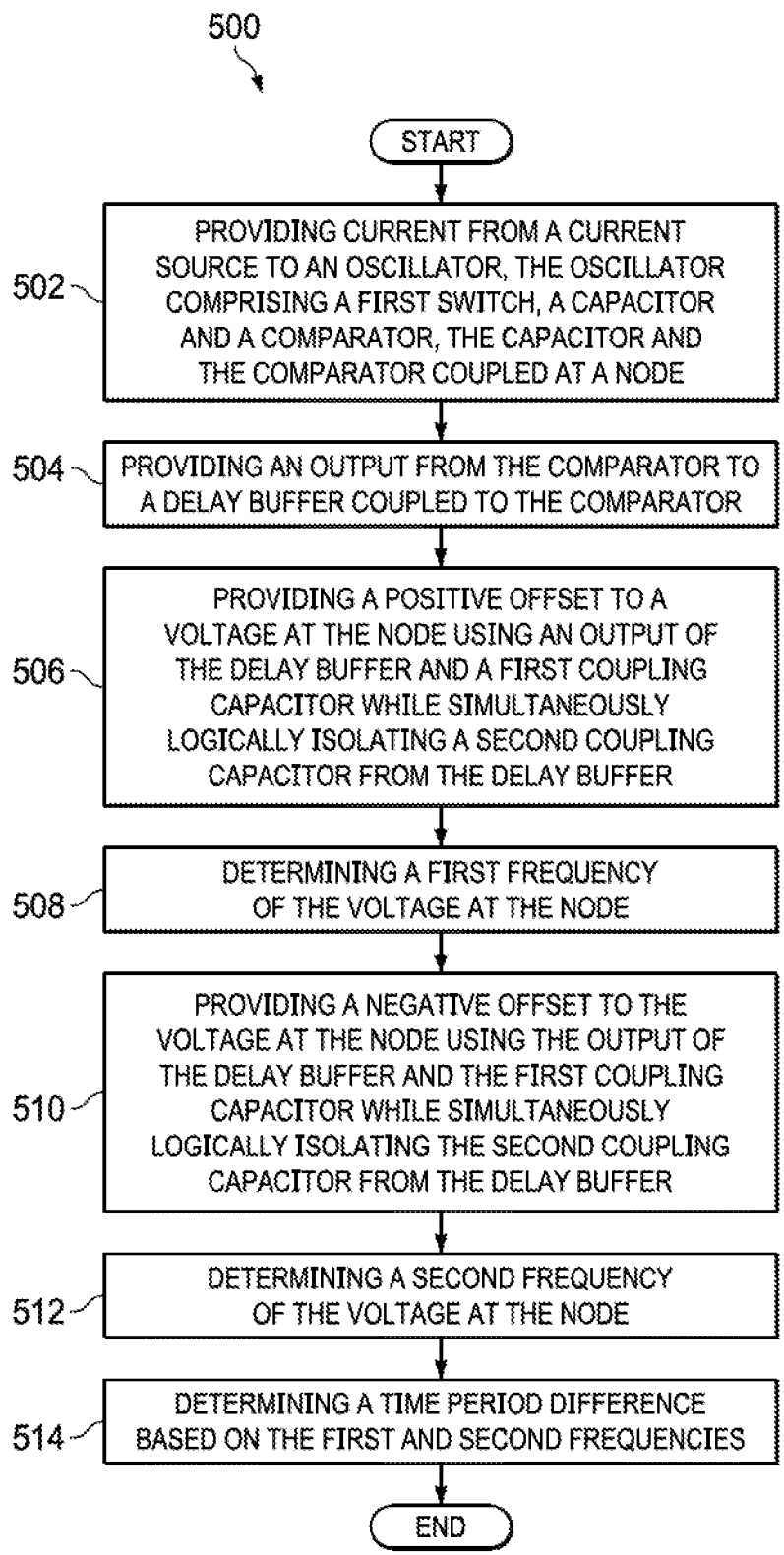
FIG. 5 is a flow diagram of an illustrative method in accordance with various examples.

FIG. 5 is a flow diagram of an illustrative method 500 in accordance with various examples. The method 500 may include providing current from a current source to an oscillator (step 502). In some examples, the aforementioned current source may be external to the oscillator, and in some examples, the aforementioned current source may form part of the oscillator. The oscillator may include a first switch, a capacitor, and a comparator, with the capacitor and comparator being coupled at a node. The method 500 then may include providing an output from the comparator to a delay buffer coupled to the comparator (step 504). The method 500 may include providing a positive offset to a voltage at the node using an output of the delay buffer and a first coupling capacitor while simultaneously and logically isolating (e.g., using switches) a second coupling capacitor from the delay buffer (step 506). The method 500 may subsequently include determining (e.g., using a digital controller) a first frequency of the voltage at the node (step 508). The method 500 may additionally include providing (e.g., by a digital controller) a negative offset to the voltage at the node using the output of the delay buffer and the first coupling capacitor while simultaneously and logically isolating (e.g., by a digital controller) the second coupling capacitor from the delay buffer (step 510). The method 500 may still further include determining (e.g., by a digital controller) a second frequency of the voltage at the node (step 512) and determining (e.g., by a digital controller) a time period difference based on the first and second frequencies (step 514). Although not expressly depicted in FIG. 5, in some examples, the steps of method 500 may be repeated using the second coupling capacitor while isolating the first coupling capacitor from the delay buffer. A ratio of the time period differences may then be determined and used as an identifier (e.g., by a digital controller), as described above.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A circuit comprising:
    a first terminal;
    a second terminal;
    at least one delay buffer having an input, a first output, and a second output, the input of the at least one delay buffer coupled to the first terminal of the circuit;
    a first sub-circuit having an input and an output, the input of the first sub-circuit coupled to the first output of the at least one delay buffer;
    a first capacitor having a first terminal and a second terminal, the first terminal of the first capacitor coupled to the output of the first sub-circuit and the second terminal of the first capacitor coupled to the second terminal of the circuit;
    a second sub-circuit having an input and an output, the input of the second sub-circuit coupled to the second output of the at least one delay buffer; and
    a second capacitor having a first terminal and a second terminal, the first terminal of the second capacitor coupled to the output of the second sub-circuit and the second terminal of the second capacitor coupled to the second terminal of the circuit.

2. The circuit of claim 1, wherein the first sub-circuit comprises:
    a buffer coupled to the at least one delay buffer;
    a first switch coupled between the buffer and the first terminal of the first capacitor;
    a inverter coupled to the at least one delay buffer; and
    a second switch coupled between the inverter and the first terminal of the first capacitor; and
    a third switch coupled between ground and the first terminal of the first capacitor.

3. The circuit of claim 2, wherein the buffer is a first buffer and the inverter is a first inverter, the second sub-circuit comprising:
    a second buffer coupled to the at least one delay buffer;
    a fourth switch coupled between the second buffer and the first terminal of the second capacitor;
    a second inverter coupled to the at least one delay buffer; and
    a fifth switch coupled between the second inverter and the first terminal of the second capacitor; and
    a sixth switch coupled between a ground terminal and the first terminal of the second capacitor.

4. The circuit of claim 3, wherein the first switch, the second switch, the third switch, the fourth switch, the fifth switch, and the sixth switch are adapted to be coupled to a digital controller.

5. The circuit of claim 1, wherein the first sub-circuit comprises:
    a first gate having a first input, a second input, and an output, the first input terminal of the first gate coupled to the at least one delay buffer and the second input of the first gate adapted to be coupled to a digital controller; and
    a second gate having a first input, a second input, and an output, the first input of the second gate coupled to the output of the first gate, the second input of the second gate adapted to be coupled to the digital controller, and the output of the second gate coupled to the first terminal of the first capacitor.

6. The circuit of claim 5, wherein the second sub-circuit comprises:
    a third gate having a first input, a second input, and an output, the first input of the third gate coupled to the at least one delay buffer and the second input of the third gate adapted to be coupled to the digital controller; and
    a fourth gate having a first input, a second input, and an output, the first input of the fourth gate coupled to the output of the third gate, the second input of the fourth gate adapted to be coupled to the digital controller, and the output of the fourth gate coupled to the first terminal of the second capacitor.

7. The circuit of claim 5, wherein the first gate is an XOR gate and the second gate is an AND gate.

8. The circuit of claim 1, wherein the at least one delay buffer comprises:
    a first delay buffer coupled to the first sub-circuit; and
    a second delay buffer coupled to the second sub-circuit.

9. A method comprising:
    receiving, by a first terminal of a first capacitor, an oscillating signal;
    receiving, by a first terminal of a second capacitor, the oscillating signal;

receiving, by a delay buffer, a digital signal;
providing, by the delay buffer, a delayed digital signal, a time delay after receiving the digital signal;
receiving, by a second terminal of the first capacitor, the delayed digital signal, during a first phase;
receiving, by the second terminal of the first capacitor, an inverse of the delayed digital signal, during a second phase;
receiving, by a second terminal of the second capacitor, the delayed digital signal, during a third phase; and
receiving, by the second terminal of the second capacitor, the inverse of the delayed digital signal, during a fourth phase.

10. The method of claim 9, further comprising:
generating, by an oscillator, the oscillating signal; and
outputting, by a comparator of the oscillator, the digital signal.

11. The method of claim 9, further comprising:
receiving, by a digital controller, the digital signal; and
analyzing, by the digital controller, the digital signal.

12. The method of claim 11, wherein analyzing the digital signal comprises:
determining a first period of the digital signal during the first phase;
determining a second period of the digital signal during the second phase;
determining a third period of the digital signal during the third phase; and
determining a fourth period of digital signal during the fourth phase.

13. The method of claim 11, wherein analyzing the digital signal further comprises:
determining a first difference between the first phase and the second phase;
determining a second difference between the third phase and the fourth phase; and
determining a ratio between the first difference and the second difference.

14. The method of claim 11, further comprising generating, by the digital signal, a physically unclonable function, based on analyzing the digital signal.

15. The method of claim 11, further comprising:
during the first phase, controlling, by the digital controller, a first switch, a second switch, a third switch, a fourth switch, a fifth switch, and a sixth switch, comprising:
controlling the first switch to be closed;
controlling the second switch to be open;
controlling the third switch to be open;
controlling the fourth switch to be closed;
controlling the fifth switch to be open; and
controlling the sixth switch to be open;
during the second phase, controlling, by the digital controller, the first switch, the second switch, the third switch, the fourth switch, the fifth switch, and the sixth switch, comprising:
controlling the first switch to be open;
controlling the second switch to be open;
controlling the third switch to be closed;
controlling the fourth switch to be open;
controlling the fifth switch to be closed; and
controlling the sixth switch to be open;
during the third phase, controlling, by the digital controller, the first switch, the second switch, the third switch, the fourth switch, the fifth switch, and the sixth switch, comprising:
controlling the first switch to be open;
controlling the second switch to be closed;
controlling the third switch to be open;
controlling the fourth switch to be closed;
controlling the fifth switch to be open; and
controlling the sixth switch to be open; and
during the fourth phase, controlling, by the digital controller, the first switch, the second switch, the third switch, the fourth switch, the fifth switch, and the sixth switch, comprising:
controlling the first switch to be open;
controlling the second switch to be closed;
controlling the third switch to be open;
controlling the fourth switch to be open;
controlling the fifth switch to be open; and
controlling the sixth switch to be closed.

16. The method of claim 11, further comprising:
controlling, by the digital controller, a first XOR gate, a first AND gate, a second XOR gate, and a second AND gate, during the first phase, the second phase, the third phase, and the fourth phase.

17. A system, comprising:
an oscillator;
a digital controller; and
a circuit coupled to the oscillator and to the digital controller, the circuit comprising:
at least one delay buffer coupled to the oscillator;
a first sub-circuit coupled to the at least one delay buffer and to the digital controller;
a first capacitor having a first terminal and a second terminal, the first terminal of the first capacitor coupled to the first sub-circuit and the second terminal of the first capacitor coupled to the oscillator;
a second sub-circuit coupled to the at least one delay buffer and to the digital controller; and
a second capacitor having a first terminal and a second terminal, the first terminal of the second capacitor coupled to the first sub-circuit and the second terminal of the second capacitor coupled to the oscillator.

18. The system of claim 17, wherein the first sub-circuit comprises:
a buffer coupled to the at least one delay buffer;
a first switch coupled between the buffer and the first terminal of the first capacitor;
a inverter coupled to the at least one delay buffer; and
a second switch coupled between the inverter and the first terminal of the first capacitor; and
a third switch coupled between ground and the first terminal of the first capacitor.

19. The system of claim 17, wherein the first sub-circuit comprises:
a first gate having a first input, a second input, and an output, the first input of the first gate coupled to the at least one delay buffer and the second input terminal of the first gate configured to be coupled to the digital controller; and
a second gate having a first input, a second input, and an output, the first input of the second gate coupled to the output of the first gate, the second input of the second gate adapted to be coupled to the digital controller, and the output of the second gate coupled to the first terminal of the first capacitor.

20. The system of claim 17, wherein the at least one delay buffer comprises:
a first delay buffer coupled to the first sub-circuit; and a second delay buffer coupled to the second sub-circuit.

* * * * *